US 9,116,781 B2

(12) United States Patent
Vogelsang et al.

(10) Patent No.: US 9,116,781 B2
(45) Date of Patent: Aug. 25, 2015

(54) MEMORY CONTROLLER AND MEMORY DEVICE COMMAND PROTOCOL

(71) Applicant: Rambus Inc., Sunnyvale, CA (US)

(72) Inventors: Thomas Vogelsang, Mountain View, CA (US); Brent Haukness, Monte Sereno, CA (US); Stephen Charles Bowyer, Raleigh, NC (US)

(73) Assignee: Rambus Inc., Sunnyvale, CA (US)

( * ) Notice: Subject to any disclaimer, the term of this patent is extended or adjusted under 35 U.S.C. 154(b) by 181 days.

(21) Appl. No.: 13/653,033

(22) Filed: Oct. 16, 2012

(65) Prior Publication Data

US 2013/0132685 A1    May 23, 2013

Related U.S. Application Data

(60) Provisional application No. 61/548,196, filed on Oct. 17, 2011, provisional application No. 61/691,702, filed on Aug. 21, 2012.

(51) Int. Cl.
*G06F 12/00* (2006.01)
*G06F 13/16* (2006.01)

(52) U.S. Cl.
CPC ............ *G06F 12/00* (2013.01); *G06F 13/1694* (2013.01)

(58) Field of Classification Search
CPC .............................. G06F 12/00; G06F 13/1694
USPC ........... 711/154, 100; 379/111; 257/E27.103, 257/E21.682; 365/185.02, 185.24, 185.06, 365/230.06, 208, 149
See application file for complete search history.

(56) References Cited

U.S. PATENT DOCUMENTS

| 6,510,503 | B2* | 1/2003 | Gillingham et al. .......... 711/167 |
| 7,215,595 | B2* | 5/2007 | Kiehl ........................ 365/189.18 |
| 7,755,961 | B2 | 7/2010 | Rao |
| 7,813,178 | B2 | 10/2010 | Nakai |
| 7,843,725 | B2 | 11/2010 | Sarin et al. |
| 7,881,141 | B2 | 2/2011 | Abe |
| 7,961,534 | B2 | 6/2011 | Kang et al. |
| 2005/0154817 | A1* | 7/2005 | Barth et al. .................... 711/100 |
| 2007/0091664 | A1* | 4/2007 | Chow et al. .................... 365/145 |
| 2008/0123451 | A1* | 5/2008 | Rao ................................ 365/203 |
| 2008/0168217 | A1* | 7/2008 | Vogelsang .................... 711/106 |
| 2009/0268514 | A1 | 10/2009 | Mae |
| 2011/0032775 | A1* | 2/2011 | Lovett ...................... 365/189.06 |
| 2011/0093669 | A1* | 4/2011 | Davis et al. .................... 711/154 |

OTHER PUBLICATIONS

Richard Crisp, "Direct Rambus Technology: The New Main Memory Standard", Nov./Dec. 1997, Micro IEEE, vol. 17 Issue 6, pp. 18-28.*

* cited by examiner

*Primary Examiner* — Cheng-Yuan Tseng
*Assistant Examiner* — Kamal K Dewan
(74) *Attorney, Agent, or Firm* — Lance Kreisman; Peninsula Patent Group

(57) ABSTRACT

Embodiments generally relate to a command protocol and/or related circuits and apparatus for communication between a memory device and a memory controller. In one embodiment, the memory controller includes an interface for transmitting commands to the memory device, wherein the memory device includes bitline multiplexers, and accessing of memory cells within the memory device is carried out by a command protocol sequence that includes a wordline selection, followed by bitline selections by the bitline multiplexers. In another embodiment, a memory device includes bitline multiplexers and further includes an interface for receiving a command protocol sequence that specifies a wordline selection followed by bitline selections by the bitline multiplexers.

18 Claims, 13 Drawing Sheets

| Command | Description | Address Needed |
|---|---|---|
| ACT | Assert a word line of the memory and connect a plurality of memory cells of the memory to bitlines | Row for WL |
| SNS | Connect the bitlines to sense amplifiers, and sense data of the plurality of memory cells | BL for BL mux |
| RD | Transfer of data stored in latches of the sense amplifiers to input/output (I/O) circuitry of the memory | Col. For SA to DQ |
| WRT | Transfer of data to latches of write drivers in the memory from input/output (I/O) circuitry of the memory | Col. For DQ to SA |
| TRF | Transfer data in latches of write drivers to the plurality of memory cells, wherein the latches of the write amplifiers are connected to the bitlines through a bitline multiplexer | BL for BL mux |
| PRE | Pre-charging of sense amplifiers of memory and resetting the sense amplifiers (Allowing for next RD or WRT) | May need Bank Add. |
| DEA | De-assert a word line and disconnect a plurality of memory cells of the memory from bitlines | May need Bank Add. |

Note: SNS and TRF are introduced to accommodate the BL multiplexers, and therefore, need a corresponding BL multiplexer address to operate.

FIGURE 3

| Action | ACT | DEA | PRE | RD | SNS | TRF | WRT |
|---------|-----|-----|-----|----|-----|-----|-----|
| Read    | X   | X   | X   | X  | X   | -   | -   |
| Write   | X   | X   | X   | -  | -   | X   | X   |
| Refresh | X   | X   | X   | -  | X   | X   | -   |

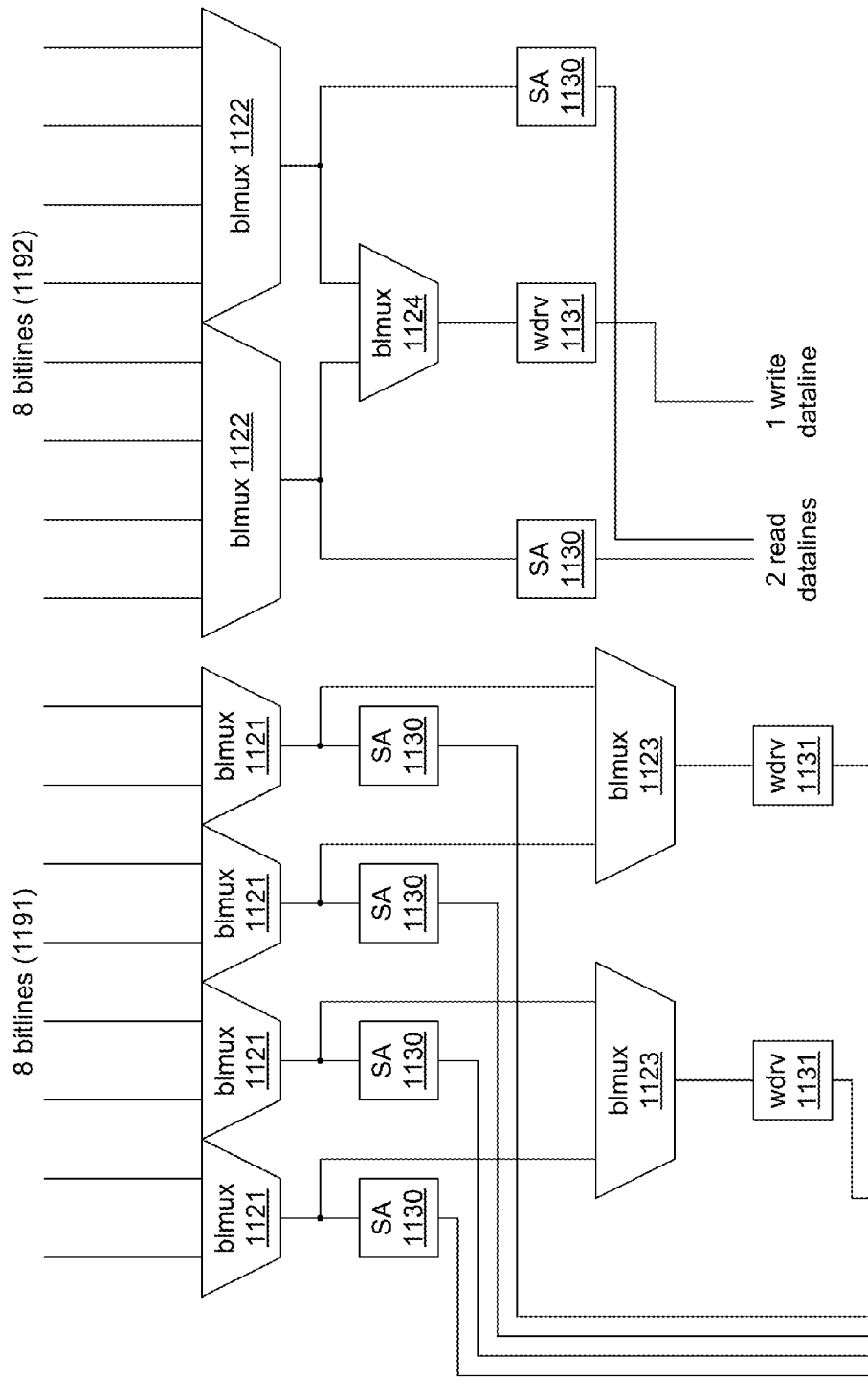

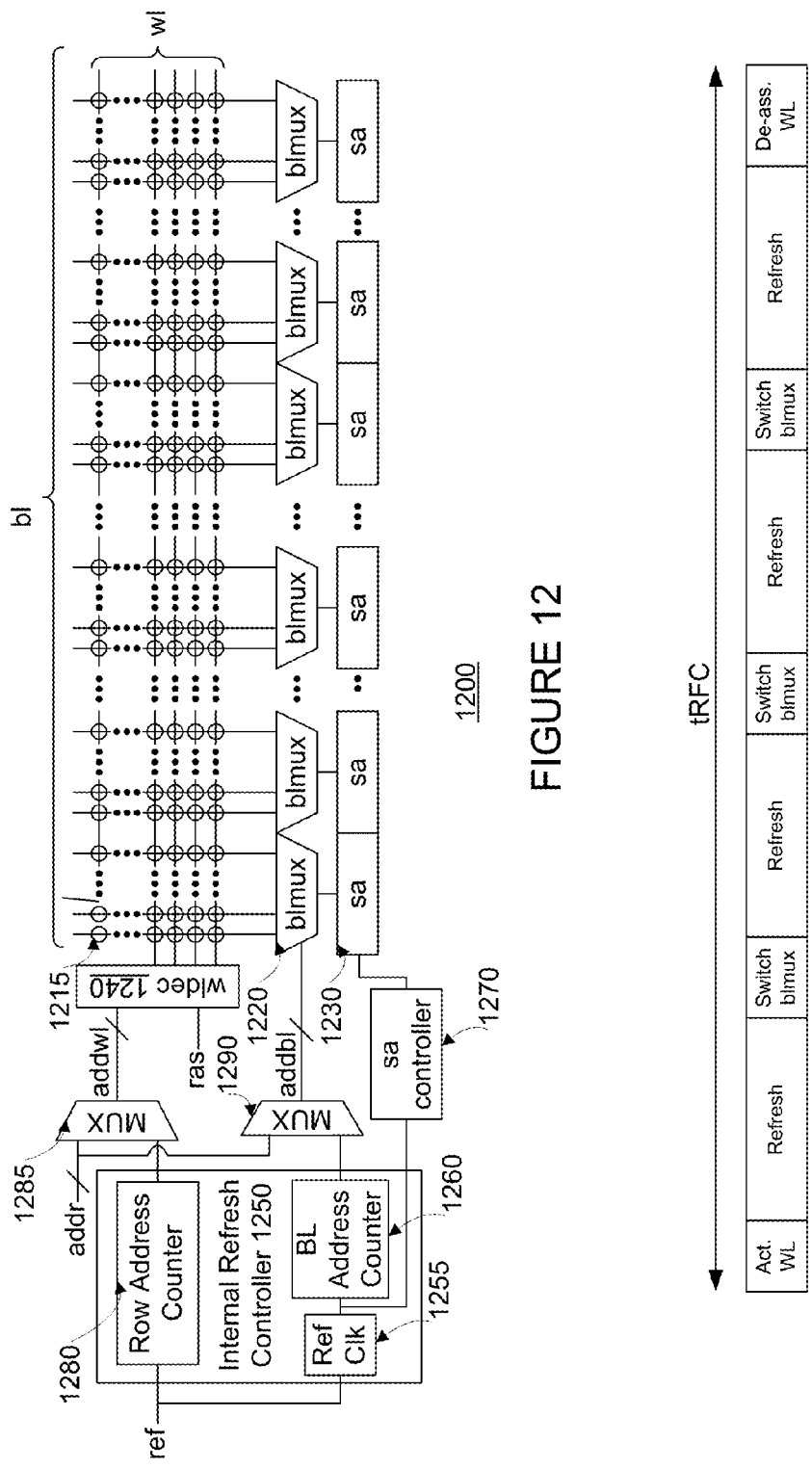

MEMORY CONTROLLER AND MEMORY DEVICE COMMAND PROTOCOL

This application claims priority to U.S. provisional application Ser. No. 61/548,196, entitled "MEMORY CONTROLLER AND MEMORY DEVICE COMMAND PROTOCOL," filed Oct. 17, 2011, and U.S. provisional application Ser. No. 61/691,702, entitled "OPTIMIZING BITCELL OPERATIONS," filed Aug. 21, 2012, which are hereby incorporated by reference as if set forth in full in the application for all purposes.

BACKGROUND

Memory devices such as dynamic random-access memories (DRAMs) are typically accessed by selecting wordlines and bitlines that correspond to memory cells of the memory device being accessed. Sense amplifiers provide sensing data of the memory cells and/or the transferring of data into the memory cells. Memory refresh operations are typical requirements in memory devices, where a memory refresh operation periodically reads information from memory cells, and immediately rewrites the read information to the same memory cells with no modifications. Each memory refresh cycle refreshes a succeeding area of a memory array.

BRIEF DESCRIPTION OF THE DRAWINGS

The various embodiments disclosed herein are illustrated by way of example, and not by way of limitation, in the figures of the accompanying drawings and in which like reference numerals refer to similar elements.

FIG. 3 presents a table of example memory controller commands.

FIG. 4 presents a table of example memory actions, and corresponding commands of the example memory command protocol.

FIG. 8A illustrates a time line of commands for an example steaming of data reads from multiple banks of a memory device that includes bitline multiplexers.

FIG. 8B illustrates a time line of commands for an example steaming of data read from multiple banks of a memory device that does not include bitline multiplexers.

FIG. 8C illustrates a time line of commands for an example steaming of data written to multiple banks of a memory device that includes bitline multiplexers.

FIG. 8D illustrates a time line of commands for an example refresh of memory cells of multiple banks of a memory device that includes bitline multiplexers.

FIG. 11A illustrates an example memory device that includes bitline multiplexers having a different width for read operations than for write operations.

FIG. 11B illustrates another example memory device that includes bitline multiplexers having a different width for read operations than for write operations.

FIG. 12 illustrates an example memory device that includes an internal refresh controller and bitline multiplexers, according to one embodiment.

FIG. 13 illustrates an example timeline of a bitcell refresh operation, according to one embodiment.

DETAILED DESCRIPTION

In various embodiments disclosed a memory command protocol used for controlling memory devices is described, as well as memory devices and memory controller devices that may use such a command protocol. An example memory command specifies connection of a plurality of memory cells to a plurality of bitlines. Another example memory command specifies connecting the plurality of bitlines to a plurality of sense amplifiers. The plurality of sense amplifiers sense data stored in the plurality of memory cells in response to the second command. Another example command specifies an operation in which, the memory device receives data to be provided to write drivers in connection with a write operation. Yet another example command specifies initiating a transfer of data held in the write drivers to the plurality of memory cells. Another example command specifies precharging the plurality of sense amplifiers of the memory device. Another example command specifies de-assertion of the wordline, wherein the plurality of memory cells is disconnected from the plurality of bitlines associated with the plurality of memory cells. Accordingly, within various embodiments disclosed herein, the disclosed memory command protocol may be used to provide efficient streaming of writing data to and reading data from memory devices.

Various embodiments disclosed herein provide optimized bitcell operations in integrated-circuit memory devices. In one embodiment, a memory device includes wordlines, bitlines, and memory cells, where each wordline when selected couples respective memory cells to respective bitlines. The memory device includes an internal refresh controller that, in response to a refresh command selects one or more of the wordlines. In one embodiment, the internal refresh controller selects a first bitline multiplexer address to perform a first bitcell operation, and selects a second bitline multiplexer address to perform a second bitcell operation. The memory device also includes a set of S sense amplifiers, where each wordline when selected couples M respective memory cells to M respective bitlines, wherein M/S is an integer N, and wherein N>1.

Figure 1:
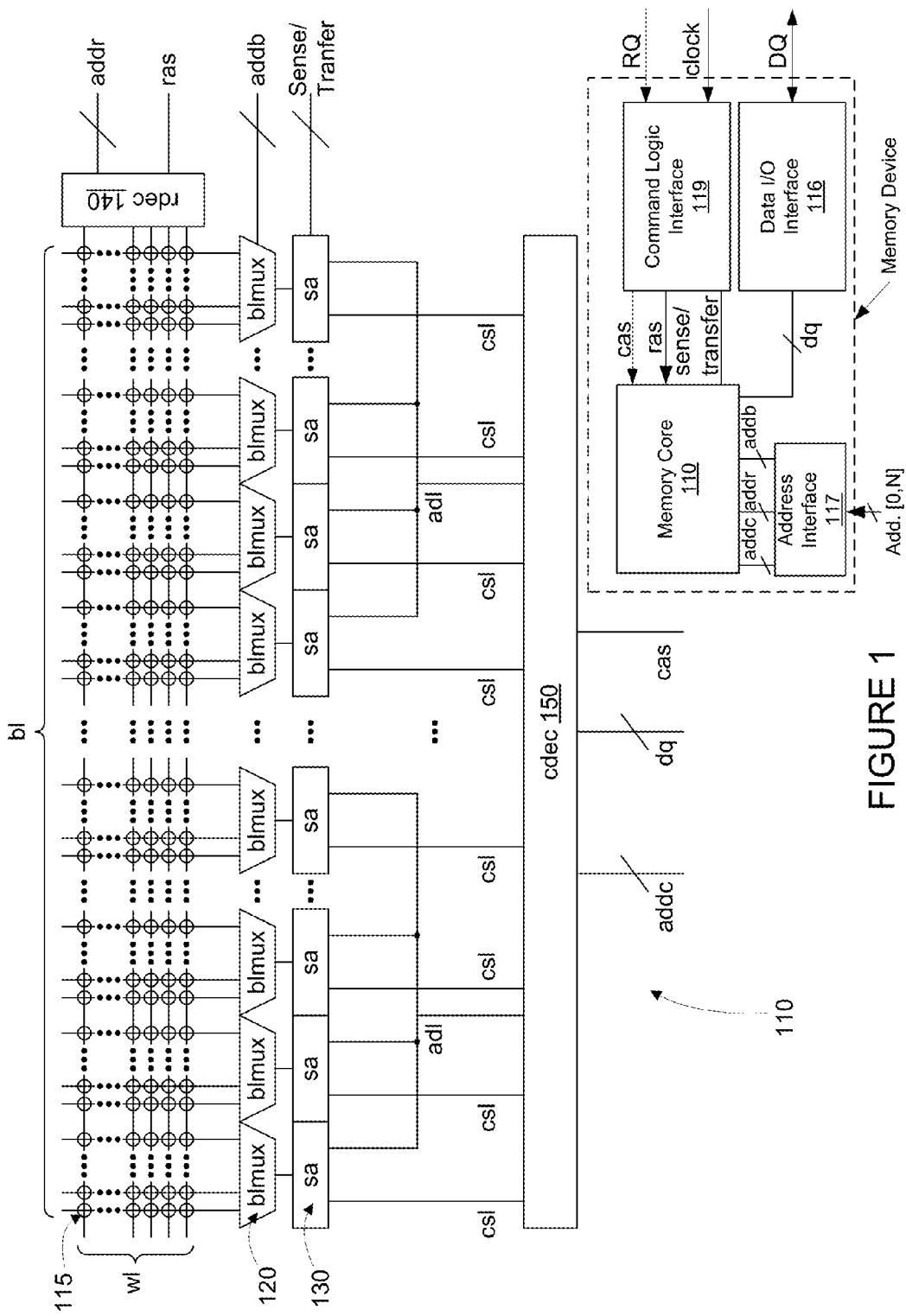
FIG. 1 illustrates a memory device according to an embodiment.

FIG. 1 illustrates a memory device according to an embodiment. This embodiment of the memory device includes a command logic interface 119 which receives a command via channel (RQ) and a clock, a Data I/O interface 116 which receives and transmits data DQ, an address interface 117 that receives an address Add[0,N], and a memory core 110. The command logic interface 119 generates a column address strobe (CAS), a row address strobe (RAS) and controls the sense/transfer control line. The Data I/O interface 116 is coupled via the data path (dq) to the memory core 110. The address interface 117 generates a column address (addc), a row address (addr) and a bitline address (addb). While the interface signals RQ, DQ, Add[0,N], and clock are shown on separate interface lines, it is to be understood that other embodiments may include the interface lines being shared for the different interface signals. That is, the application of the different interface signals can be time multiplexed over common or shared interface lines.

The memory core 110 includes memory cells (115) that are selected (for a read or a write) by wordlines (wl) and bitlines (bl). For embodiments, the wordline selection is made by a row decoder 140 as determined by the row address (addr) and the row address strobe (RAS) signal. In various embodiments, a selected number of the bitlines are connected to the sense amplifiers (sa) 130 as determined by bitline multiplexers (blmux) 120. For at least one embodiment, the bitline selection of the bitline multiplexers 120 is made by the bitline address (addb). The sense amplifiers 130 are connected to the array data lines (adl) as determined by column select lines (csl) of a column decoder 150. The column selection (which sets the state of the column select lines) of the column decoder 150 is determined by the column address (addc) and column address strobe (CAS) signal. The data path (dq) transports data for reading and writing data to the memory cells through sense amplifiers 130. It is to be understood that the term "sense amplifier" may be considered to refer to a circuit block that might in reality consist of a different read ("sense amplifier") and write amplifier ("write driver") in addition to a cross coupled sense amplifier circuit. As applicable, the term "sense amplifier" may also be considered to refer to the cross coupled sensing circuit separate from a read sense amplifier or write driver.

In various embodiments, data is written to the memory cells or read from the memory cells during times when the sense amplifiers (or write drivers) 130 are connected through the bitline multiplexers 120 to the selected memory cells 115. For a memory read, data from the selected memory cells is sensed by the sense amplifiers 130 as controlled by a sense/transfer control line. The data is stored by the sense amplifiers 130 and conveyed to the data path dq through array data lines (adl) and through the column decoder 150. For a memory write, data received through the data path (dq) is coupled through the column decoder 150 and is stored within the sense amplifiers (or write drivers) 130 (stored, for example, within latches of the sense amplifiers 130). The data then is transferred from the sense amplifiers (write drivers) 130 through the bitline multiplexers 120 to the selected memory cells 115 as controlled by the bitline address (addb) and the sense/transfer control line.

In an embodiment, bitline multiplexers 120 reduces the number of sense amplifiers (or write drivers) 130 needed to sense or transfer data to the memory cells 115. That is, in each region served by a given set of sense amplifiers, there are more bitlines than sense amplifiers 130, thereby requiring less electronic circuitry than memory devices that have a sense amplifier for each bitline.

Additionally, for embodiments of the memory device that includes memory cells that retain data during a wordline selection, multiple memory cell reads and/or writes to different cells on different bitlines can be made for a single wordline selection. That is, a single wordline is selected, followed by multiple memory cell transfers (writes) and/or multiple senses (reads), which allows for efficient streaming of memory writes or memory reads, or a combination of memory reads and memory writes. Additionally, cells (as selected by a wordline) are connected to bitlines, but not necessarily connected to a sense amplifier 130. The bitline multiplexers 130 determine which cells are connected to sense amplifiers 130 as controlled by the bitline address (addb).

Additionally, in at least some embodiments, sensing the data within a memory cell does not automatically start a new refresh. The refresh rate, if any, can be determined by the volatility of the memory cells. The time between refreshes is set to be less than the volatility of the memory cells. For any of the described embodiments, the operations associated with the memory device include refreshing the memory cells as frequently as needed given the volatility of the memory cells of the memory device.

Figure 2:
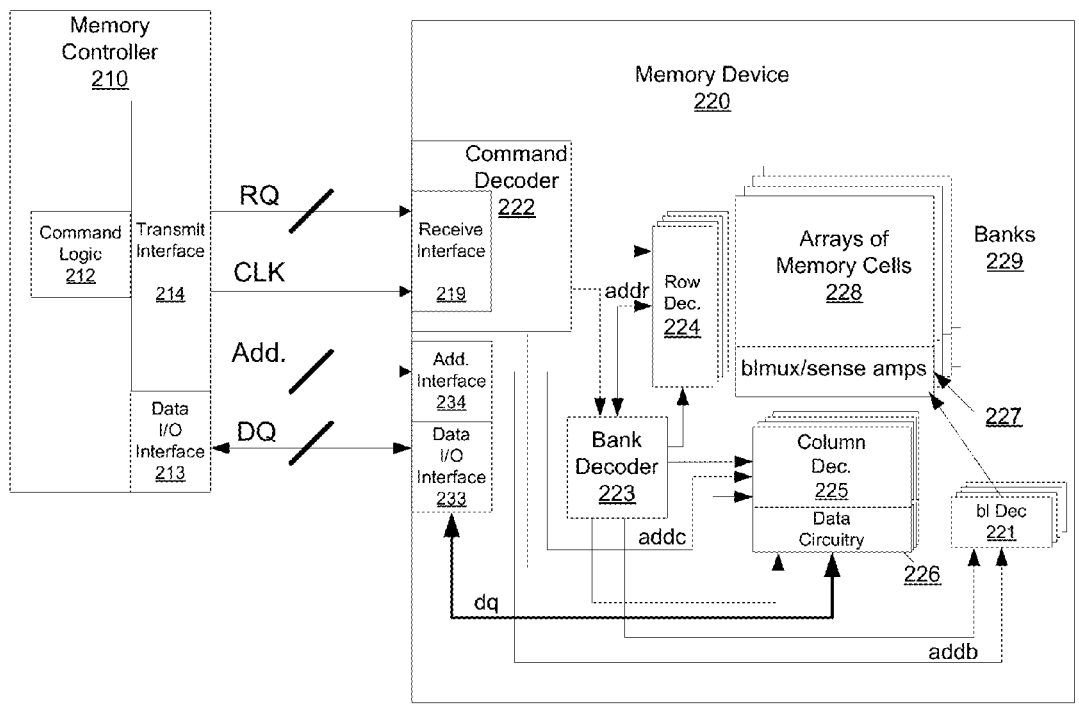
FIG. 2 illustrates an example memory controller interfaced with a memory device.

FIG. 2 illustrates an example embodiment in which a memory controller 210 is interfaced with a memory device 220. For embodiments, the memory controller 210 is an integrated circuit device which manages the flow of data going to and from the memory device 220. Embodiments of the memory controller 210 provide control signals for the memory device 220, wherein the controls signals are generated by command logic 212 within the memory controller 210 according to the memory command protocol. Example interface signals include a data signal channel (DQ) (generated and received by a Data I/O interface 213), a clock (CLK) (generated by a transmit interface 214), and a command/address channel (RQ). For at least some embodiments, the memory commands are provided by the memory controller, to the memory device, synchronously with respect to the clock. Each of the commands are transmitted by interface logic 214 of the memory controller 210 and received by a command decoder 222 of the memory device 220.

In various embodiments, commands from the memory controller 210 are encoded within the signals of the command channel (RQ) for controlling operation of the memory device 220. For one embodiment, the signals of the control channel include a chip select (CS) signal, a write enable (WE) signal, and address signals (addb, addc, addr). Each of these signals may be dedicated, or part of a command packet that is decoded to extract the signals. The control channel signals listed are provided merely as an example, and other embodiments include additional or different control channel signals.

The memory device 220, according to its ordinary and customary meaning, is an integrated circuit device (i.e., a chip) in which data can be stored and retrieved electronically. The memory device 220 of FIG. 2 includes a memory core that includes arrays of memory cells that are organized into one or more banks of memory. Individual cells of each of the banks of memory arrays are addressed, for example, by selecting wordlines (wl) and bitlines (bl). The memory cells are connected to sense amplifiers through bitline multiplexers. The wl selection is made by a row decoder 224. Selection of the sense amplifier to be connected to the array data line (adl) is made by a column decoder 225, the multiplexer selection (connection of bitlines to sense amplifiers) is made by a bitline multiplexer decoder 221, and a bank selection is made by a bank decoder 223.

A command decoder 222 includes an interface that receives the commands from the memory controller 210. Logic within the command decoder 222 is coupled to the memory core, and ensures that the commands are properly executed within the memory device 220. That is, per the commands, columns, rows, banks and bitlines are properly selected, and memory cell sensing and transferring of data are properly executed.

Data lines (DQ) are connected to a Data I/O 233, which is connected through data lines (dq) to data circuitry 226 of the memory device 220. The Data I/O 233 is a data interface that includes data receivers and transmitters. The data circuitry 226 merely illustrates the presence of data (DQ) circuits. At least a portion of the data circuitry 226 is coupled to the sense amplifiers which are coupled to the bitline multiplexers 227.

In some embodiments, the data circuitry 226 illustrates the presence of data circuits. In some embodiments, at least a portion of the data circuitry 226 may be related (and integrated into) to the blmux and sense amplifier circuits 227 and the column decoder 225.

An address register 234 may receive the address (Add.) from the memory controller 210 and may generate the column address (addc), the row address (addr) and the bitline address (addb).

FIG. 3 presents a table of example memory control commands. These memory commands are issued by the memory controller to access (read/write) data stored in a memory device. The table additionally includes a description of the memory control commands, and provides the memory addresses utilized by each of the memory control commands. It is to be understood that the naming convention used to name each of the commands are for descriptive purposes. Clearly, the commands can follow a different naming convention. Furthermore, combination commands may exist that indicate in a single command transaction that multiple actions are to be performed (for instance a read or write followed by a precharge and/or deassertion).

A first command (labeled ACT in the table of FIG. 3) specifies assertion of a wordline of a memory device, wherein assertion of the wordline connects a plurality of memory cells to a plurality of bitlines. A row address provides for the selection of a wordline.

A second command (labeled SNS in the table of FIG. 3) specifies connecting the plurality of bitlines to a plurality of sense amplifiers, wherein the plurality of sense amplifiers sense data stored in the plurality of memory cells in response to the second command. A bitline address of the bitline multiplexer determines the selection of bitlines to be connected to the sense amplifiers.

A third command (labeled RD in the table of FIG. 3) specifies a read operation, wherein during the read operation, data held in the sense amplifiers is output by the memory device in response to the third command. The data is received by the memory controller. A column address provides for selection of sense amplifiers in which data within the selected sense amplifiers is output by the memory device.

A fourth command (labeled WRT in the table of FIG. 3) specifies a write operation, wherein the memory device receives data to be provided to the write drivers during the write operation. A column address provides for selection of sense amplifiers—data received by the memory device is provided to the selected write drivers.

A fifth command (labeled TRF in the table of FIG. 3) specifies initiating a transfer of data held in the write drivers to the plurality of memory cells to store the data in the memory cells. A bitline address provides for bitline multiplexer selection of sense amplifiers to be connected to the bitlines that are connected to the plurality of memory cells.

A sixth command (labeled PRE in the table of FIG. 3) specifies precharging sense amplifiers of a memory device. For at least some embodiments, no additional address selection is not needed. For other embodiments, a bank address may be used to identify a specific bank or memory array portion where the specified precharge is targeted for the particular sense amplifiers in that bank or memory array portion as applicable. Precharging, as specified by the sixth command, may also apply to bitlines or other circuitry of the array that requires precharging.

A seventh command (labeled DEA in the table of FIG. 3) specifies de-assertion of a wordline, wherein de-assertion of the wordline disconnects memory cells from the bitlines. For at least some embodiments, address selection is not needed. For other embodiments, a bank address may be needed.

At least some embodiments of each of the commands include a bank address, while other embodiments do not include a bank address.

For one embodiment of controlling the memory device, a sequence of execution of the control commands includes a single ACT command (single wordline selection) followed by multiple SNS commands (connection of bitlines to sense amplifiers, and sensing the data of the plurality of memory cell) and multiple RD commands (transfer of data from the sense amplifiers out of the memory device). This sequence of execution provides multiple reads from the memory cells for a single wordline selection, providing for efficient reading (streaming) of data from the memory cells.

One embodiment of controlling the memory device includes a sequence of execution of the control commands that includes a single ACT command (single wordline selection) followed by multiple WRT commands (transfer of data received by the memory device to sense or write amplifiers) and multiple TRF commands (transfer of data from the sense amplifiers to the memory cells). This sequence of execution provides multiple writes to the memory cells for a single wordline selection, providing for efficient writing (streaming) of data to the memory cells.

Some embodiments of controlling the memory device include a single ACT command followed by one or more SNS, RD, WRT, and TRF commands allowing for mixed read and write operations of the memory cells with a signal wordline selection.

FIG. 4 presents a table of example memory actions, and corresponding commands of the example memory command protocol. The memory commands are listed in alphabetical order, and no sequence of the memory commands is implied. As shown in the table, for embodiments, a read from memory can include (as individual and/or combination commands) execution of an ACT command, an SNS command, a RD command, a PRE command and a DEA command. The SNS command enables multiple senses by the sense amplifiers through the bitline multiplexers for a single ACT (wordline selection). As shown in the table, for embodiments, a write to memory can include (as individual and/or combination commands) execution of a WRT command, an ACT command, at least one TRF command a PRE command, and a DEA command. The TRF command is included to enable multiple transfers of data held by sense amplifiers (alternatively, write amplifiers) through the bitline multiplexers for a single ACT (wordline selection).

Embodiments of the memory device include both volatile and non-volatile memory. For an embodiment of volatile memory, as shown in the table, for embodiments, a refresh command can include (as individual and/or combination commands) an ACT command, an SNS command, a TRF command, a PRE command and a DEA command. The ACT command and the PRE command are included to enable multiple SNS/TRF commands for a single ACT (wordline selection).

Figure 5:
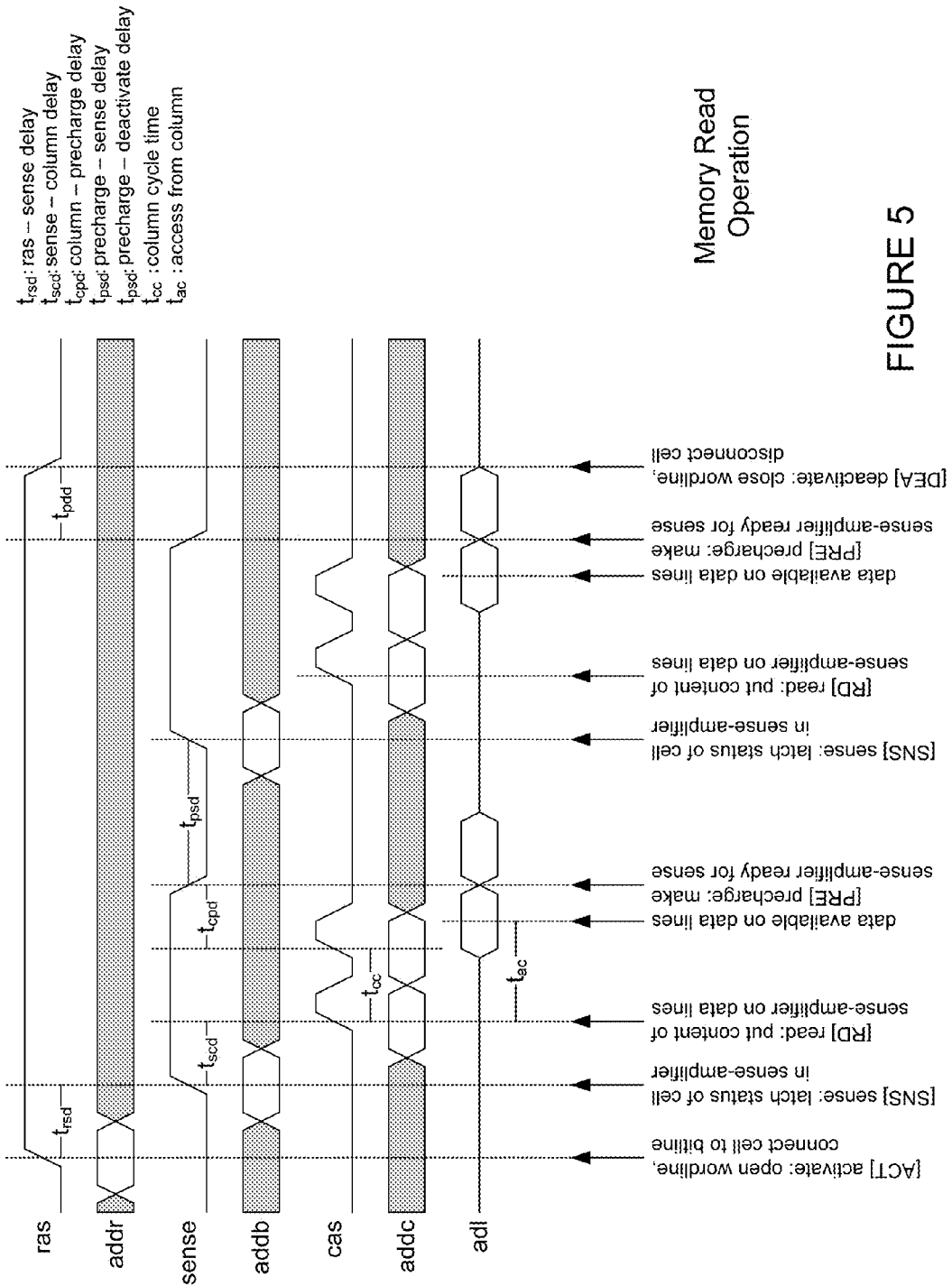
FIG. 5 illustrates time lines of command channel signals for an example plurality of memory read operations.

FIG. 5 illustrates time lines of command channel signals for an example plurality of memory read operations. This read operation includes multiple reads from memory with a single wordline selection. As shown, an ACT command is executed wherein a wordline is selected by selecting a row address (addr) with, for example, a rising edge of the row address select (RAS) signal.

Next, an SNS command is executed wherein a subset of the memory cells of the selected wordline are sensed by sense amplifiers that are connected to the subset of memory cells through the bitline multiplexers. The multiplexer bitline selections are made by selecting a bitline address (addb) with, for example, a rising edge of the sense signal (sense).

Next, an RD command is executed wherein the column decoder selects a subset of the sense amplifiers to place data on the internal data lines (adl) for transfer through to an output section (connected to dq, not shown in the timing diagram) to be output by the memory device. The selection of the sense amplifiers is made by selecting a column address (addc) with, for example, a rising edge of the column address select (CAS) signal, which, e.g., after a time offset enables a column select line (csl) for a sense amplifier associated with each adl. The selected read data appears on the adl lines a column access time ($t_{AC}$) after the read command is latched.

The first RD command in this example is followed by a second RD command, issued one column cycle time ($t_{CC}$) after the first RD command. Subsequently, a PRE command is issued to precharge the sense amplifiers so that the sense amplifiers are ready for another sense operation. The PRE command is executed, for example, based on the falling edge of the sense (sense) signal. The operation of this embodiment further includes another SNS command for the same row but a different bitline mux address, another pair of RD commands, and another PRE command, followed by a DEA command wherein the word line is de-selected. As shown and described, multiple senses and multiple reads corresponding to the multiple senses are performed for a single wordline selection.

Figure 6:
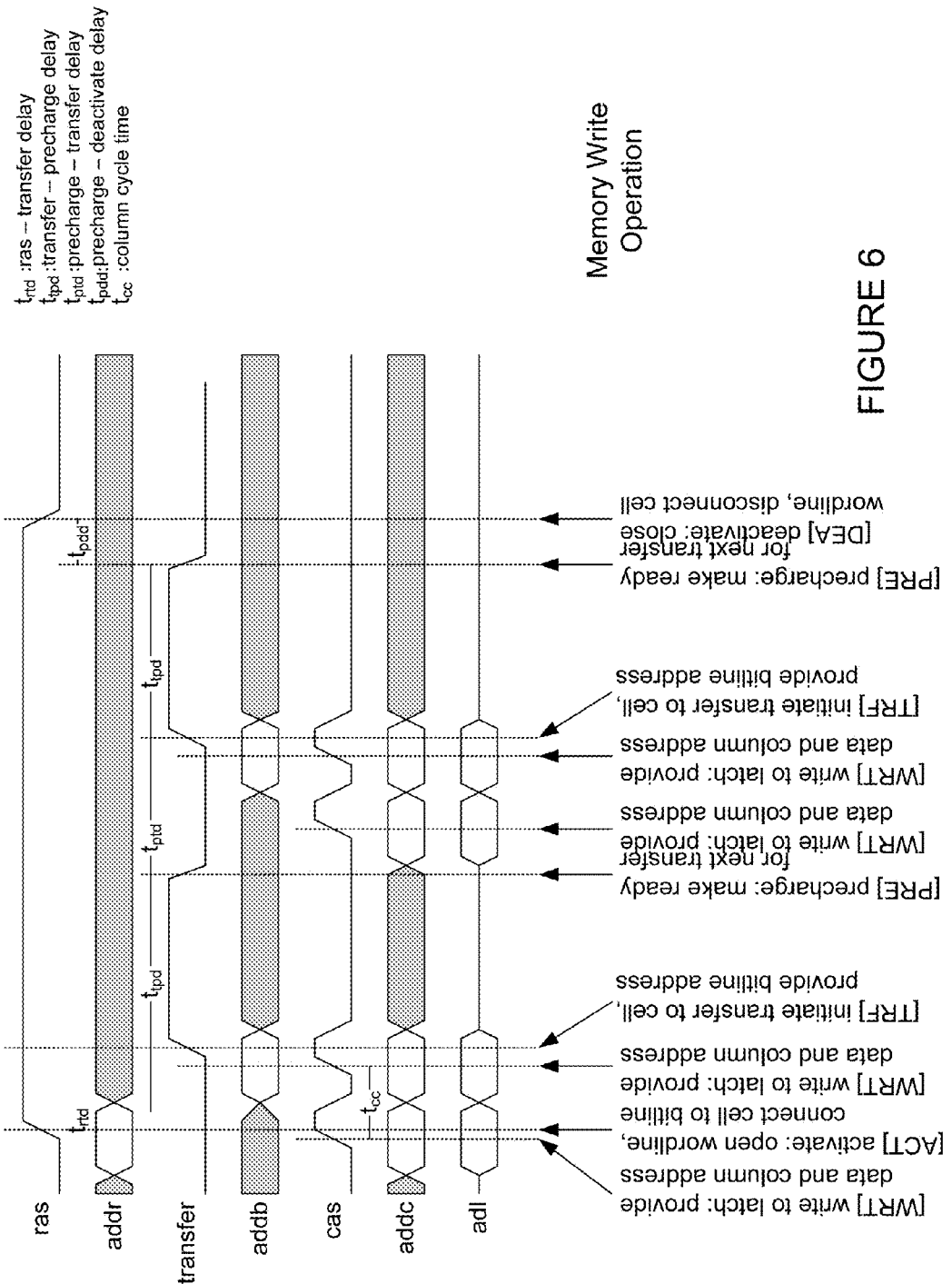
FIG. 6 illustrates time lines of command channel signals for an example plurality of memory write operations.

FIG. 6 illustrates time lines of command channel signals for an example plurality of memory write operations. This write operation sequence includes multiple writes to different column addresses related to different bitline mux addresses of the memory with a single wordline selection. As shown, two WRT commands are executed wherein data received by the memory device is latched into sense amplifiers as selected by the column address (addc) with, for example, a rising edge of the column address select (CAS) signal. An ACT command is executed wherein a wordline is selected by selecting a row address (addr) with, for example, a rising edge of the row address select (RAS) signal, and can occur in some embodiments after one or more WRT commands.

Next, a TRF command is executed which initiates a transfer of the data stored to the write latches in the two WRT commands to memory cells as selected by the bitline multiplexers. The multiplexer bitline selections are made by selecting a bitline address (addb) with, for example, a rising edge of the transfer signal (transfer).

Next, a PRE command is executed that prepares the sense amplifiers to receive data for two following WRT commands, which are followed by another TRF, a PRE and finally, a DEA which de-activates the wordline.

Figure 7:
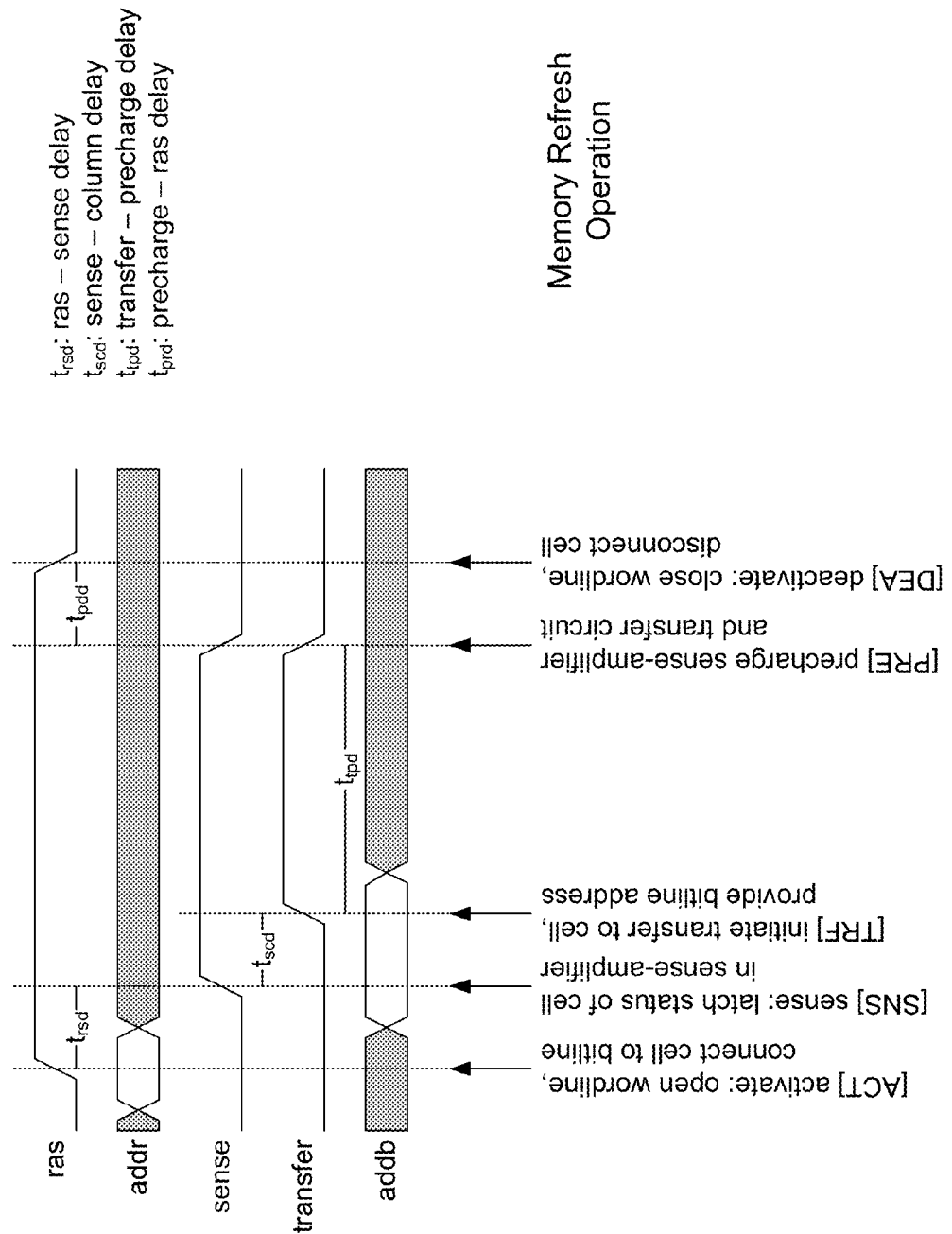
FIG. 7 illustrates time lines of command channel signals for an example memory refresh operation.

FIG. 7 illustrates time lines of command channel signals for an example memory refresh operation for volatile memory. The frequency in which the refresh is executed is typically dependent on the data retention time of the memory cells of the memory device.

As shown, an ACT command is executed wherein a wordline is selected by selecting a row address (addr) with, for example, a rising edge of the row address select (RAS) signal. This is followed by an SNS, a TRF, a PRE, and finally, a DEA to de-select the wordline.

Figures 8A, 8B, 8C, 8D:
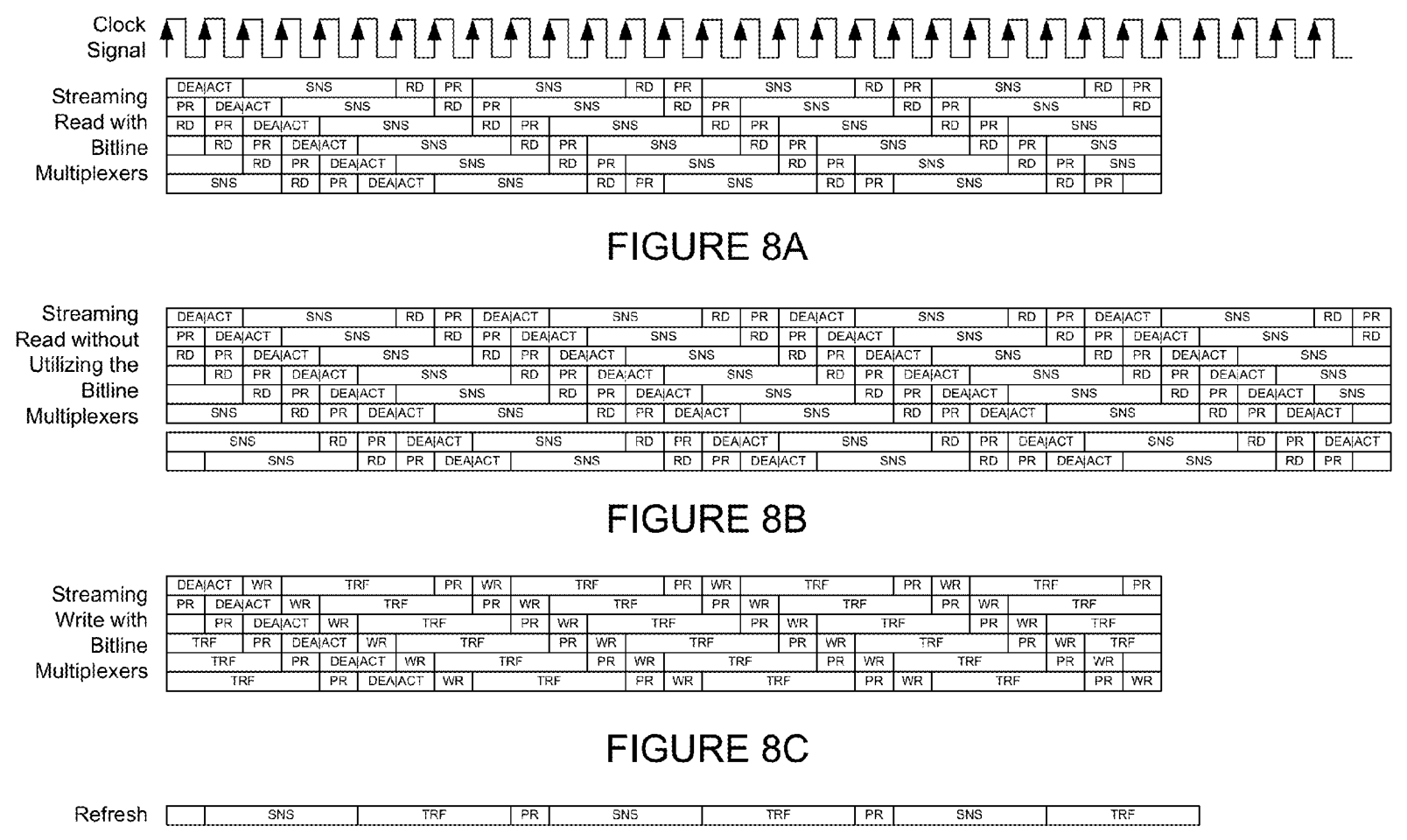

FIG. 8A illustrates a time line of commands for an example steaming of data reads from multiple banks of a memory device that includes bitline multiplexers. The time line of commands depicts an example of a sequence of commands provided by a memory controller for six banks of memory cells of the memory device. As illustrated, each command represents the duration of the internal operation of the command, but does not necessarily represent the timing of the command at the interface of the memory device. That is, each row of the time line represents the sequence of commands for each of the six banks of memory. For example, the sequence of commands for a first bank of memory is: DEA, ACT, SNS, RD, PR (PR=PRE), SNS, RD, PR, SNS, RD, PR, SNS, RD, PR. This sequence provides four reads transactions (reads are identified by the SNS, RD, PR sequence) from memory for a single wordline selection (wordline selections are identified by the DEA, ACT sequence). Also by example, the sequence of the streaming read for the second bank of the memory device is offset by one clock cycle. That is, the wordline selection (DEA, ACT sequence) of the second bank is offset from the wordline selection of the first bank by one clock cycle. Otherwise, the sequence of commands of the second bank remains the same. Also by example, the sequence of the streaming read for the third bank of the memory device is offset by two clock cycles. That is, the wordline selection (DEA, ACT sequence) of the third bank is offset from the wordline selection of the first bank by two clock cycles. Otherwise, the sequence of commands remains the same. Also by example, the sequence of the streaming read for the fourth bank of the memory device is offset by three clock cycles. That is, the wordline selection (DEA, ACT sequence) of the fourth bank is offset from the wordline selection of the first bank by three clock cycles. Otherwise, the sequence of commands remains the same. Also by example, the sequence of the streaming read for the fifth bank of the memory device is offset by four clock cycles. That is, the wordline selection (DEA, ACT sequence) of the fifth bank is offset from the wordline selection of the first bank by four clock cycles. Otherwise, the sequence of commands remains the same. Also by example, the sequence of the streaming read for the sixth bank of the memory device is offset by five clock cycles. That is, the wordline selection (DEA, ACT sequence) of the sixth bank is offset from the wordline selection of the first bank by five clock cycles. Otherwise, the sequence of commands remains the same.

As can be observed from the time line of the sequences of commands of the six banks of memory, one of the memory banks executes a read for nearly every clock cycle, thereby providing very efficient utilization of the memory, and providing efficient streaming of data from the memory device. More specifically, the sequence of commands of FIG. 8A provides an efficiency of 92% of the clock cycles. That is, 92% of the clock cycles have an associated read that is transferring data from the memory device to the memory controller.

FIG. 8B illustrates a time line of commands for an example steaming of data read from multiple banks of memory without utilizing bitline multiplexers. More generally, these are sets of commands to multiple banks of memory required to achieve the same one read per clock cycle efficiency of the embodiment of command sequences of FIG. 8A. Here, 8 banks of memory are required to maintain a similar rate of data reads, showing that the command protocol of the described embodiments provide better efficiency and use of memory than a command protocol that does not utilize the existence of the bitline multiplexers. This embodiment is less efficient because a wordline selection (DEA and ACT) is needed for each read.

FIG. 8C illustrates a time line of commands for an example streaming of data written to multiple banks of memory that include the bitline multiplexers. The writing of data to a first bank of the memory device includes, for example, a command sequence of DEA, ACT, WR, TRF, PR (PR=PRE), WR, TRF, PR, WR, TRF, PR, WR, TRF, PR. This sequence of commands includes a single wordline selection (DEA, ACT sequence) followed by multiple write operations (WR, TRF, PR). Similar to the streaming read sequences of FIG. 8A, the sequences for each of the banks of memory are offset by a single clock cycle, which results in completion of a write operation once per clock cycle for the six banks of memory.

FIG. 8D illustrates a time line of commands for an example refresh of memory cells of multiple banks of memory that include the bitline multiplexers, wherein each bank has an activated row. The example partial sequence of commands includes SNS, TRF, PR (PR=PRE), SNS, TRF, PR, SNS, TRF. The active sense amplifiers in each bank sense the data of the bitline multiplexer-selected memory cells, and then transfers the data back into the same selected memory cells providing the refresh of the selected memory cells. The precharge (PR) precharges the sense amplifiers between refreshes to prepare them for the next sense operation.

Figure 9:
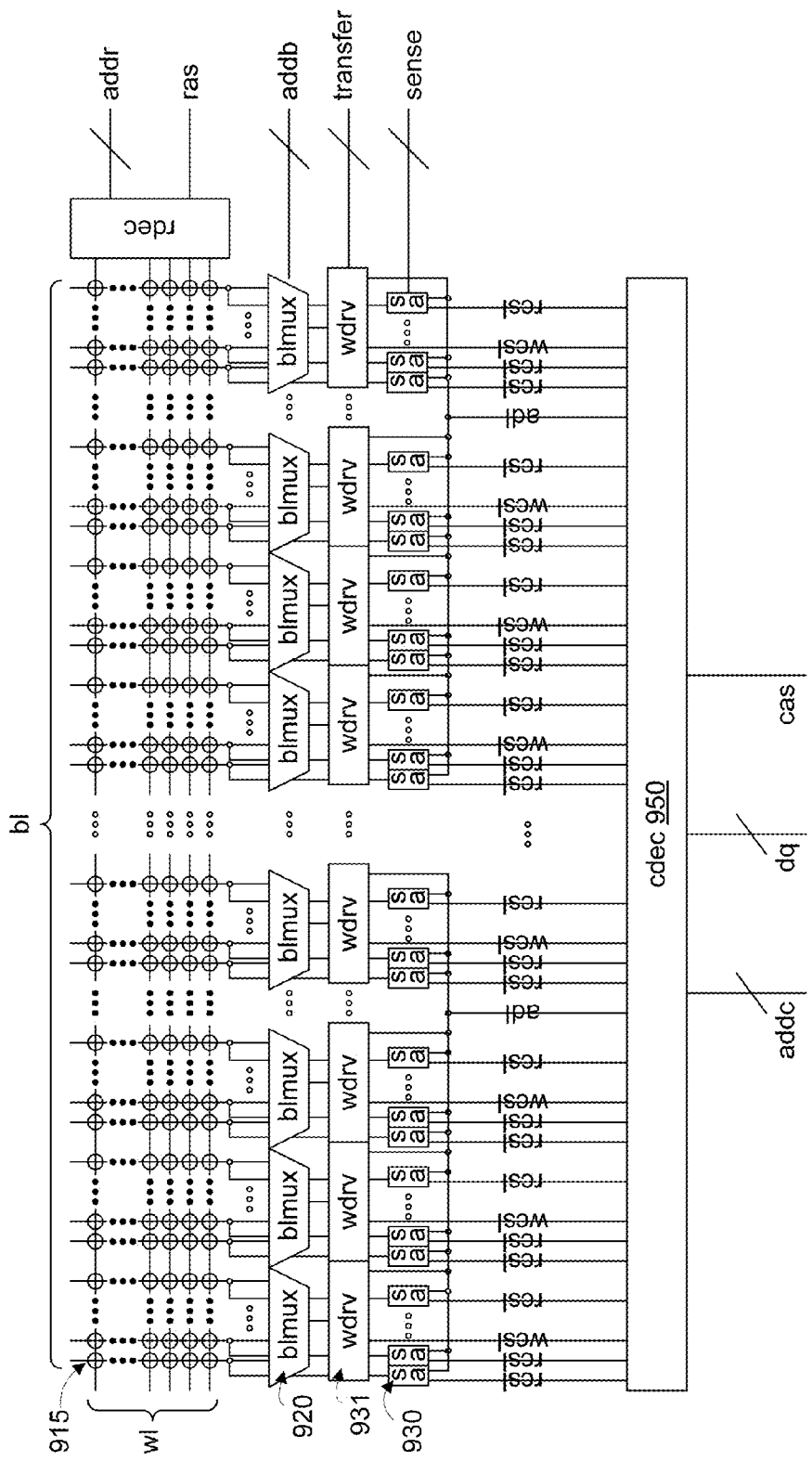
FIG. 9 illustrates an example memory device that includes write bitline multiplexers but does not include read bitline multiplexers.

FIG. 9 illustrates elements of an example memory device that includes write bitline multiplexers, but does not include read bitline multiplexers. This embodiment exemplifies that the widths of the data reads can be different than the width of the data writes. A column decoder 950 includes read column select lines (rcsl) which are connected to read sense amplifiers (sa) 930, and write column select lines (wcsl) which are connected to write drivers (wdrv) 931. The sense amplifiers (sa) 930 are connected directly to the memory cells 915 whereas the write drivers (wdrv) 931 are connected to bitline multiplexers 920. For this embodiment, the bitline multiplexers are used for writing to the memory cells 115 but not for reading from the memory cells 115. In relation to the previously described memory control commands, the number of bitlines connected to sense amplifiers of the SNS command can be different than the number of write drivers connected to bitlines of the TRF command.

This embodiment includes a one-to-one correspondence between bitlines and read sense amplifiers 930, and includes an X to 1 correspondence between bitlines and write drivers 931, wherein X is determined by the number of inputs to the bitline multiplexers 920. That is, for this embodiment, the input of each bitline multiplexer 920 is connected to a single write column select line (wcsl) and the output of each bitline multiplexer 920 is connected to X bitlines. It is to be understood that other embodiments can include a on-to-one correspondence between bitlines and write drivers, and an X to 1 correspondence between bitlines and read sense amplifiers.

Embodiments that include different widths of data for reading and writing provide memory device designers with flexibility in their designs. For example, that is the ratio of width of write bitline multiplexers to the widths of read bitline multiplexers can be selected to accommodate for size and speed variations between write bitline amplifiers and read bitline amplifiers. For example, if one type (read or write) bitline amplifier is substantially larger than the other, it may be advantageous to decrease the number of the larger amplifier, and therefore, select a larger width bitline multiplexer for the larger amplifier. Also for example, if one type (read or write) bitline amplifier is slower than the other, it may be advantageous to increase the number of that amplifier to parallelize the corresponding reads or writes associated with that amplifier.

Figures 10A, 10B:
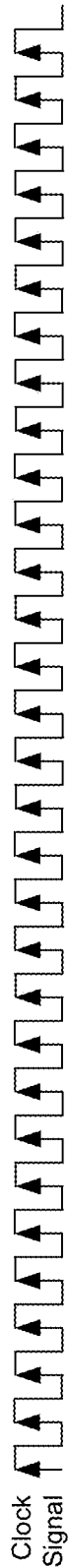
FIG. 10A illustrates a time line of command for an example streaming of data reads for a memory device that does not include a read bitline multiplexer.
FIG. 10B illustrates a time line of command for an example streaming of data writes for a memory device that includes a write bitline multiplexer.

FIG. 10A illustrates a time line of commands for an example streaming of data reads for the memory device that does not include a read bitline multiplexer, such as, the memory device of FIG. 9.

FIG. 10B illustrates a time line of commands for an example streaming of data writes for the memory device that includes a write bitline multiplexer, such as, the memory device of FIG. 9.

The time lines of the streaming reads and streaming writes of FIGS. 10A and 10B are illustrated next to each other to demonstrate the speed and efficiency tradeoffs between varying widths in the reads and writes. It is to be noted that the wide multiplexer for write requires a larger number of TRF for WR than SNS for RD.

FIG. 11A illustrates an example memory device that includes write bitline multiplexers having a different width than read bitline multiplexers. As illustrated, for this embodiment, a first layer of bitline multiplexers (blmux) 1121 are each connected to two bitlines. For a read operation, four sense amplifiers 1130 sense data of four memory cells as determined by which four bitlines are selected by the first set of bitline multiplexers 1121. That is, of the eight memory cells the eight bitlines (1191) are connected to, four of the memory cells are sensed at a time.

Further, a second layer of bitline multiplexers (layer 2 blmux) 1123 are each connected to a single write driver (wdrv) 1131. For a write operation, two write drivers 1131 are connected to two of the memory cells as determined by which of two bitlines are selected by the combination of the first layer of bitline multiplexers 1121 and the second layer of bitline multiplexers 1123. That is, of the eight memory cells the eight bitlines (1191) are connected to, two of the memory cells are written to at a time.

The configuration/combination of the first layer of bitline multiplexers 1121 and the second layer of bitline multiplexers 1123 provide for reading data from four memory cells at a time, and writing to two memory cells at a time. Clearly, different read and write ratios can be configured depending upon the number of inputs to the bitline multiplexers, and the number of layers of bitline multiplexers.

As illustrated in FIG. 11B, a first layer of bitline multiplexers 1122 are each connected to four bitlines. For a read operation, two sense amplifiers 1130 sense data of two memory cells as determined by which two bitlines are selected by the third layer of bitline multiplexers 1122. That is, of the eight memory cells the eight bitlines (1192) are connected to, two of the memory cells are sensed at a time.

Further, a second layer bitline multiplexer 1124 is connected to a single write driver (wdrv) 1131. For a write operation, one write drivers 1131 is connected to a single memory cells as determined by which of bitline is selected by the combination of the first layer of bitline multiplexers 1122 and the second layer of bitline multiplexer 1124. That is, of the eight memory cells the eight bitlines (1192) are connected to, one of the memory cells is written to at a time.

The configuration/combination of the first layer of bitline multiplexers 1122 and the second layer bitline multiplexer 1124 provide for reading data from two memory cells at a time, and writing to one memory cell at a time. Clearly, different read and write ratios can be configured depending upon the number of inputs to the bitline multiplexers, and the number of layers of bitline multiplexers.

FIG. 12 illustrates elements of an example memory device 1200 that includes an internal refresh controller and bitline multiplexers (blmux), according to one embodiment. The memory device 1200 also includes memory cells 1215 that are selected (for a read or a write) by wordlines (wl) and bitlines (bl). In one embodiment, the wordline selection is made by a row decoder 1240 as determined by a row address (addr) and a row access select (RAS) signal. In one embodiment, a selected number of the bitlines are connected to the sense amplifiers (sa) 1230 as determined by the bitline multiplexers (blmux) 1220. In one embodiment, the bitline selection of the bitline multiplexers 1220 is made by a bitline address (addbl) which is generated by a bitline address decoder (not shown).

In one embodiment, data is written to the memory cells or read from the memory cells during the time when the sense amplifiers 1230 are connected through the bitline multiplexers 1220 to the selected memory cells 1215. For a memory read, data from the selected memory cells is transferred through the bitline multiplexers 1220 according to the bitline address (addbl) and sensed by the sense amplifiers 1230 as controlled by a sense/transfer control line. The data is stored by the sense amplifiers 1230 (stored, for example, within latches of the sense amplifiers 1230).

The inclusion of the bitline multiplexers 1220 advantageously reduces the number of sense amplifiers 1230 needed to sense or transfer data to or from the memory cells 1215. That is, there are more bitlines than sense amplifiers 1230, thereby requiring less sensing circuitry per bitline.

Additionally, in one embodiment, the memory cells 1215 retain data during a wordline selection, and multiple sequential memory cell reads and/or writes may be made for a single wordline selection. That is, a single wordline is selected, and followed by multiple memory cell transfers (writes) and/or multiple senses (reads), which allows for efficient streaming of memory writes or memory reads, or a combination of memory reads and memory writes. Additionally, cells (as selected by a wordline) are connected to bitlines, but not necessarily connected to a sense amplifier 1230. The bitline multiplexers 1220 determine which cells are connected to sense amplifiers 1230 as controlled by the bitline address (addbl).

Additionally, in one embodiment, sensing the data within a memory cell does not automatically start a new refresh. The refresh rate may be determined according to the volatility of the memory cells. The time between refreshes is set to be, e.g., less than the volatility of the memory cells. For any of the described embodiments, the operations associated with the memory device include refreshing the memory cells as frequently as needed given the volatility of the memory cells of the memory device.

In one embodiment, the memory device 1200 also includes an internal refresh controller 1250, which includes a refresh clock 1255, a bitline address counter 1260, and a row address counter 1280. In other embodiments, the internal refresh counter structure and addressing may not correspond directly to externally supplied row and bitline addresses. In one embodiment, the refresh clock 1255 may be a system clock. In one embodiment, the refresh clock couples to a sense amplifier controller (sa control) 1270, which couples to sense amps 1230. The memory device 1200 also includes multiplexers 1285 and 1290, which accept respectively the output of row address counter 1280 and bitline address counter 1260 at one input, and externally supplied addresses at another input. The multiplexer 1285 couples to the wordline decoder 1240 to select rows using wordline addresses (addwl). The multiplexer 1290 couples to the bitline multiplexers (blmux) to select one or more bitline multiplexers using bitline multiplexer addresses (addbl).

In one embodiment, for each refresh row address the internal refresh controller 1250 counts through N bitline multiplexer addresses. When the internal refresh controller 1250 receives a refresh command, the internal refresh controller 1250 activates the row indicated by row address counter 1280 and then cycles through the N bitline multiplexer addresses during the refresh period, while also controlling the timing of the sense amplifiers 1230 via the sense amp controller 1270.

In one embodiment, each sense amplifier 1230 shown in FIG. 12 may represent multiple sense amplifiers. In one embodiment, the sense amplifiers 1230 may be arranged in any suitable hierarchical scheme. For example, in one embodiment a sense amplifier 1230 shown may represent a local sense amplifier and a global sense amplifier.

As FIG. 12 shows, multiple bitlines share the same bitline multiplexer. In various embodiments, each bitcell operation is optimized by cycling through the multiple bitlines that share the same bitline multiplexer, which is described in more detail below in connection with FIG. 14.

FIG. 13 illustrates an example timeline 1300 of a bitcell refresh operation, according to one embodiment. As described in more detail below in connection with FIG. 14, in one embodiment, while the wordline addressed for a refresh remains selected, the internal refresh controller 1250 sequentially performs bitcell operations for each of N bitline multiplexer addresses resulting in N refresh cycles for a given external refresh command or internal self-refresh operation. In this example embodiment, the bitcell operations are refresh operations. In other embodiments, the bitcell operations may include copy and move operations between, e.g., two bitline-multiplexed memory locations. As FIG. 13 shows, the internal refresh controller 1250 first activates a wordline (Act. WL) and then performs a series of bitcell operations. The internal refresh controller 1250 switches the bitline multiplexers after each bitcell operation. After completing the bitcell operations, the internal refresh controller 1250 de-asserts the wordline.

Embodiments may extend refresh cycle time (tRFC) and support 1 cycle or N cycle refresh commands (or mode register options). In one embodiment, the number of refresh cycles performed per refresh command may be smaller than the bitline multiplexer ratio but greater than one in order to trade off tRFC versus number of refresh cycles. In various embodiments, the number of refresh cycles per refresh command or event may be configurable to 1, N, and/or one or more intermediate values.

Figure 14:
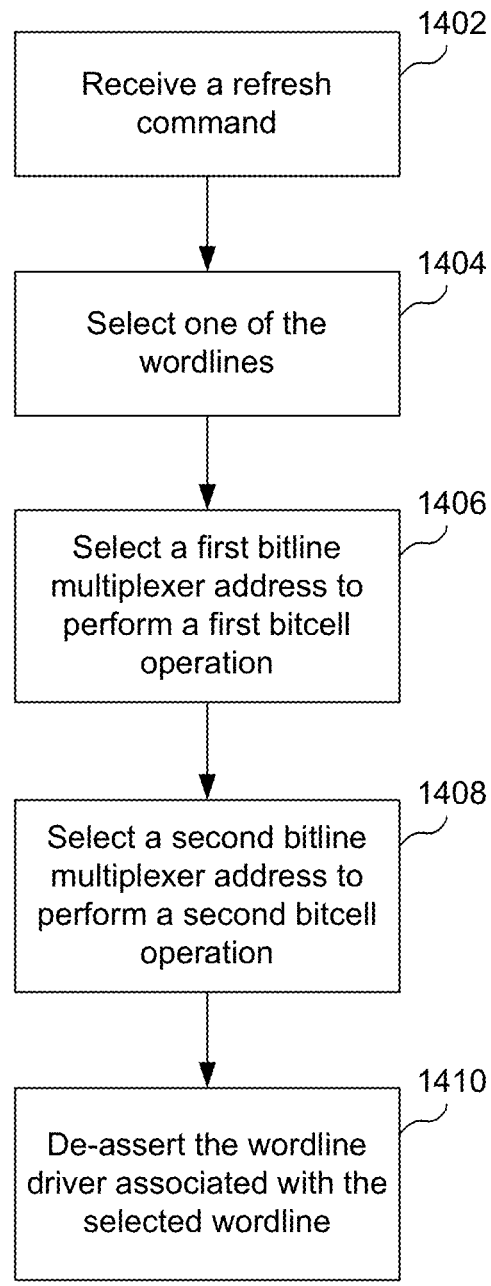
FIG. 14 illustrates an example simplified flow diagram for optimizing bitcell operations, according to one embodiment.

FIG. 14 illustrates an example simplified flow diagram for optimizing bitcell operations, according to one embodiment. Referring to both FIGS. 12 and 14, a method is initiated in block 1402, where the internal refresh controller 1250 receives a refresh command. In block 1402, in response to receiving the refresh command, the internal refresh controller 1250 activates one or more wordlines. In various embodiments, the internal refresh controller 1250 selects a wordline by asserting a wordline driver associated with the wordline.

In various embodiments, for each refresh operation, the internal refresh controller 1250 asserts a selected wordline once, and while maintaining the assertion, the internal refresh controller 1250 cycles through one or more bitline multiplexer addresses to perform multiple refreshes.

In one embodiment, each wordline when asserted couples respective memory cells to respective bitlines. In one embodiment, each wordline when asserted couples M respective memory cells to M respective bitlines, where M/S is an integer N, where S is a number of S sense amplifiers, and where N>1. In one embodiment, the number of sense amplifiers activated may be a fraction of the physical wordline length.

In one embodiment, while an asserted wordline remains asserted, the internal refresh controller 1250 sequentially performs an internal bitcell operation for each of N bitline multiplexer addresses by coupling, for each multiplexer address, each sense amplifier in the set of S sense amplifiers with a respective bitline in a subset of the M bitlines.

In block 1406, the internal refresh controller 1250 selects a first bitline multiplexer address to perform a first bitcell operation. In various embodiments, for each refresh command, the internal refresh controller cycles through multiple bitline multiplexer addresses to perform multiple bitcell operations, as described in examples below.

In block 1408, the internal refresh controller 1250 selects a second bitline multiplexer address to perform a second bitcell operation. In various embodiments, the internal refresh controller 1250 can continue to select additional bitline multiplexer addresses to perform additional respective bitcell operations. In one embodiment, in response to respective multiplexer address selections, each bitline multiplexer couples a respective one of N different subsets of the M bitlines to the S sense amplifiers.

In one embodiment, the bitcell operations (e.g., first and second bitcell operations) may include refresh operations. In various embodiments, the bitcell operations may be performed in response to a self-refresh or auto-refresh event. In one embodiment, the bitcell operations (e.g., first and second bitcell operations) may include copy operations. For example, a bitcell operation may migrate data within a row, where the internal refresh controller 1250 activates one portion of a bitline multiplexer 1220 (using a first wordline address), reads data, and stores the data in the corresponding sense amplifier 1230. The internal refresh controller 1250 then activates another portion of the same bitline multiplexer 1220 (using a second wordline address), and then writes the data from the sense amplifier 1230 into the other portion of the bitline multiplexer 1220 (using the second wordline address). In one embodiment, the bitcell operations (e.g., first and second bitcell operations) may include move operations.

In block 1410, the internal refresh controller 1250 de-asserts the wordline driver associated with the selected wordline after performing the bitcell operations.

Although the steps, operations, or computations may be presented in a specific order, the order may be changed in particular embodiments. For example, in one embodiment, the internal refresh controller 1250 may first activate the wordline and then assert a bitline. In another embodiment, the internal refresh controller 1250 may first assert a bitline and then activate the wordline. Other orderings of the steps are possible, depending on the particular implementation. In some particular embodiments, multiple steps shown as sequential in this specification may be performed at the same time.

As described herein, various embodiments provide a memory device that includes an array having wordlines, array bitlines, and memory cells, where each wordline when selected couples respective memory cells to respective array bitlines. In some embodiments, the memory device also includes bitline multiplexers, each bitline multiplexer having a multiplexed bitline and selectably coupling the multiplexed bitline to one of a respective plural subset of the array bitlines according to a bitline multiplexer address. In some embodiments, the memory device also includes an internal controller that, in response to a command: selects at least one of the wordlines; addresses at least one of the bitline multiplexers with a first bitline multiplexer address to perform a first memory cell operation while the at least one of the wordlines remains selected; and addresses at least one of the bitline multiplexers with a second bitline multiplexer address to perform a second memory cell operation while the at least one of the wordlines remains selected.

With further regard to the memory device, in some embodiments, the command is from the group of commands including an external refresh command, a copy command, a move command, and an internal self-refresh event. In some embodiments, the memory device further includes a set of sense amplifiers, each associated with a respective bitline multiplexer. In some embodiments, in response to respective multiplexer address selections, each bitline multiplexer couples a respective one of N different subsets of the array bitlines to the sense amplifier associated with that bitline multiplexer. In some embodiments, the first and second memory cell operations are internal refresh operations. In some embodiments, the first and second bitcell operations include refresh operations, the internal controller sequentially addressing at least one of the bitline multiplexers with respective bitline multiplexer addresses and performing refresh operations, while the at least one of the wordlines remains selected, and until all memory cells coupled to the selected wordline have been refreshed. In some embodiments, the first and second bitcell operations include read and write portions of a copy operation. In some embodiments, the internal refresh controller de-asserts a wordline driver associated with the selected wordline subsequent to performing the first and second memory cell operations.

With further regard to the memory device, in some embodiments, the memory device further includes: write drivers coupled respectively to the multiplexed bitlines to perform writes to the memory cells; and sense amplifiers coupled respectively to the array bitlines to perform reads from the memory cells, where the number of write drivers is less than the number of sense amplifiers. In some embodiments, the memory device further includes: write drivers coupled respectively to the multiplexed bitlines to perform writes to the memory cells; and sense amplifiers coupled respectively to the array bitlines to perform reads from the memory cells, the memory device further including second bitline multiplexers, where each write driver is coupled respectively to plural multiplexed bitlines through a corresponding one of the second bitline multiplexers.

In some embodiments, a method of operating a memory device includes selecting a first wordline of wordlines of an array, where each wordline when selected couples respective memory cells to respective array bitlines. In some embodiments, while the first wordline remains selected, the method also includes addressing a first bitline multiplexer with a first bitline multiplexer address to perform a first partial refresh operation in response to a refresh command. In some embodiments, while the first wordline remains selected, the method also includes addressing the first bitline multiplexer with a second bitline multiplexer address to perform a second partial refresh operation in response to the refresh command, where the first and second partial refresh operations each refresh a different strict subset of the memory cells coupled to the array bitlines by the first wordline.

With further regard to the method, in some embodiments, the refresh command is from the group of commands including an external refresh command and an internal self-refresh event. In some embodiments, the method further includes coupling a respective one of N different subsets of the array bitlines to the sense amplifier associated with that bitline multiplexer in response to respective multiplexer address selections. In some embodiments, the method further includes sequentially addressing at least one of the bitline multiplexers with respective bitline multiplexer addresses and performing partial refresh operations, while at least one of the wordlines remains selected, and until all memory cells coupled to the selected wordline have been refreshed. In some embodiments, the first and second partial refresh operations include read and write portions of a copy operation. In some embodiments, the method further includes de-asserting a wordline driver associated with the selected wordline subsequent to performing the first and second partial refresh operations.

In some embodiments, a memory device includes an array including wordlines, array bitlines, and memory cells, where each wordline when selected couples respective memory cells to respective array bitlines. In some embodiments, the memory devices also includes first bitline multiplexers, each bitline multiplexer having a multiplexed bitline and selectably coupling the multiplexed bitline to one of a respective plural subset of the array bitlines according to a bitline multiplexer address. In some embodiments, the memory device also includes write drivers coupled respectively to the multiplexed bitlines to perform writes to the memory cells. In some embodiments, the memory device also includes sense amplifiers coupled respectively to the array bitlines to perform reads from the memory cells.

With further regard to the memory device, in some embodiments, the number of sense amplifiers is equal to the number of array bitlines. In some embodiments, the number of sense amplifiers is less than the number of array bitlines, and where each sense amplifier is coupled respectively to plural array bitlines through a corresponding one of the first bitline multiplexers. In some embodiments, the number of write drivers is less than the number of sense amplifiers, the memory device further including second bitline multiplexers, where each write driver is coupled respectively to plural multiplexed bitlines through a corresponding one of the second bitline multiplexers.

For ease of illustration, various embodiments are described herein in the context of DRAM memory devices. These embodiments also apply to memory devices employing other technologies such as conductive-bridging RAM (CBRAM), resistive random-access memory (RRAM or ReRAM) and magnetoresistive random-access memory (MRAM) memory devices. Some memory devices such as these examples have non-destructive reads. In other words, wordline activation does not corrupt cell data states. In various embodiments applied to these types of memory devices, the bitline multiplexers may be used in order to ease pitch constraints between memory cells and sense amplifiers or write drivers. For these types of memory devices with non-destructive wordline access, embodiments may cycle through multiple bitlines for each refresh operation, as described above.

Embodiments described herein can provide various benefits. For example, embodiments can save overall refresh energy by reducing wordline transitions. Reducing power consumption is especially beneficial in mobile device applications. Embodiments can accommodate memory devices with smaller page sizes used, due to larger read/write circuits limiting the number of bits that can be refreshed simultaneously. Embodiments can reduce overhead and power consumption by decreasing the number of refresh commands and associated wordline activations needed to refresh the entire memory device.

The memory controller of the described embodiments may be a dedicated memory controller (i.e., a packaged or unpackaged IC die designed primarily for the purposes of providing an interface between one or more attached memory components and a processor, DMA and/or another integrated circuit device within a host system), or may constitute part of a processor, application-specific IC (ASIC) or other device that performs functions beyond memory access and control. In either case, a number of the controller component actions described herein may instead be carried out by a programmed processor (or dedicated hardware or combination of hardware and programmed processor), with results or instructions arising from those actions issued to the controller component as a set of commands.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or images may thereafter be used in device fabrication, for example, by enabling generation of one or more masks that are used to form various components of the circuits in a device fabrication process. In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. An address or other value provided "in" or "with" a command may be transmitted concurrently (i.e., at least partly overlapping in time) with a group of bits containing a command code or identifier, or prepended, appended or otherwise transmitted in association with the command code or identifier. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation of a memory controller, the method comprising:
    transmitting a first command that specifies assertion of a wordline of a memory device, wherein assertion of the wordline connects a plurality of memory cells to a plurality of bitlines;
    transmitting a second command that specifies connecting the plurality of bitlines to a plurality of sense amplifiers, wherein the plurality of sense amplifiers sense data stored in the plurality of memory cells in response to the second command; and
    transmitting a third command that specifies a data transfer operation and is accompanied by a column address, wherein the column address specifies a subset that is less than all of the plurality of sense amplifiers for the data transfer operation.

2. The method of claim 1, wherein:
    the third command specifies a read operation, wherein during the read operation, data held in the addressed subset of the plurality of sense amplifiers is output by the memory device in response to the third command; and
    receiving the data output by the memory device.

3. The method of claim 1, wherein:
    the third command specifies a write operation, wherein the memory device receives data to be provided to the addressed subset of the plurality of sense amplifiers during the write operation; and
    transmitting the data to the memory device.

4. The method of claim 1, further comprising transmitting a fifth command that specifies initiating a transfer of data held in the sense amplifiers to the plurality of memory cells.

5. A memory controller comprising:
    logic to generate first, second, and third commands, wherein:
        the first command specifies assertion of a wordline of a memory device, wherein assertion of the wordline connects a plurality of memory cells to a plurality of bitlines;
        the second command specifies coupling the plurality of bitlines to a plurality of sense amplifiers, wherein the plurality of sense amplifiers sense data stored in the plurality of memory cells in response to the second command;
        the third command specifies a data transfer operation and is accompanied by a column address that specifies a subset that is less than all of the plurality of sense amplifiers to be associated with the data transfer operation; and
    an interface to transmit the first command, the second command, and the third command to the memory device.

6. The memory controller of claim 5, wherein the third command specifies a read operation, wherein during the read operation, data is output by the memory device in response to the third command, the memory controller further comprising input receivers to receive the data output by the memory device.

7. The memory controller of claim 5, wherein the third command specifies a write operation, the memory controller comprising output driver circuitry to provide data associated with the write operation to the memory device.

8. The memory controller of claim 5, wherein the logic generates a fifth command, that specifies initiating a transfer of data held in the plurality of sense amplifiers to the plurality of memory cells, wherein the interface transmits the fifth command to the memory device.

9. The memory controller of claim 5, wherein the logic generates:
    a sixth command that specifies precharging sense amplifiers of a memory device; and
    a seventh command that specifies de-assertion of a wordline, wherein de-assertion of the wordline disconnects a plurality of memory cells from a plurality of bitlines associated with the plurality of memory cells; and
    wherein the interface circuit transmits the sixth command and the seventh command to the memory device.

10. A method of operation of a memory device, the method comprising:
    receiving a first command that specifies assertion of a wordline of the memory device, wherein assertion of the wordline connects a plurality of memory cells to a plurality of bitlines;
    receiving a second command that specifies coupling the plurality of bitlines to a plurality of sense amplifiers, wherein the plurality of sense amplifiers sense data stored in the plurality of memory cells in response to the second command; and
    transmitting a third command that specifies a data transfer operation, the third command accompanied by a column address, wherein the column address specifies a subset that is less than all of the plurality of sense amplifiers for the data transfer operation.

11. The method of claim 10, wherein:
    the third command specifies a read operation, wherein during the read operation, data held in the addressed subset of the plurality of sense amplifiers is output by the memory device in response to the third command; and
    transmitting the data.

12. The method of claim 10, wherein:
    the third command specifies a write operation, wherein the memory device receives data to be provided to the addressed subset of the plurality of sense amplifiers during the write operation; and
    receiving the data.

13. The method of claim 10, further comprising receiving a fifth command that specifies initiating a transfer of data held in the plurality of sense amplifiers to the plurality of memory cells.

14. The method of claim 13, further comprising write drivers coupled to the plurality of sense amplifiers, and wherein a number of the sense amplifiers that are connected to bitlines of the second command is different than a number of the write drivers that are connected to bitlines in response to the fifth command.

15. A memory device comprising:
a memory core including a plurality of memory cells, a plurality of sense amplifiers associated with the plurality of memory cells, a wordline coupled to the plurality of memory cells, and a plurality of bitlines associated with the plurality of memory cells;
an interface coupled to the memory core, the interface to receive first, second and third commands, wherein:
the first command specifies assertion of the wordline wherein during assertion, the plurality of memory cells is coupled to the plurality of bitlines;
the second command specifies coupling the plurality of bitlines to the plurality of sense amplifiers, wherein the plurality of sense amplifiers sense data stored in the plurality of memory cells in response to the second command; and
the third command specifies a data transfer operation and is accompanied by a column address that specifies a subset that is less than all of the plurality of sense amplifiers to be associated with the data transfer operation.

16. The memory device of claim 15, wherein the third command specifies a read operation, wherein during the read operation, data held in the addressed subset of the plurality of sense amplifiers is output by the memory device in response to the third command.

17. The memory device of claim 15, wherein the third command specifies a write operation, wherein the memory device receives data to be provided to the addressed subset of the plurality of sense amplifiers in response to the third command.

18. The memory device of claim 17, wherein the interface receives a fifth command that specifies initiation of a transfer of data held in the sense amplifiers to the plurality of memory cells.

* * * * *